United States Patent [19]

Tanaka et al.

[11] Patent Number: 5,008,702
[45] Date of Patent: Apr. 16, 1991

[54] EXPOSURE METHOD AND APPARATUS

[75] Inventors: Tsutomu Tanaka, Yokohama; Yoshitada Oshida, Fujisawa; Masataka Shiba, Yokohama; Naoto Nakashima, Kurita; Ryuichi Funatsu, Yokohama, all of Japan

[73] Assignee: Hitachi, Ltd., Tokyo, Japan

[21] Appl. No.: 401,619

[22] Filed: Aug. 31, 1989

[30] Foreign Application Priority Data

Sep. 7, 1988 [JP] Japan ................................ 63-222355

[51] Int. Cl.$^5$ ...................... G03B 27/68; G03B 27/42
[52] U.S. Cl. ........................................ 355/52; 355/55; 355/53
[58] Field of Search ...................... 355/53, 73, 92, 52; 269/21; 378/34; 356/400, 401

[56] References Cited

U.S. PATENT DOCUMENTS

| 4,391,511 | 7/1983 | Akiyama et al. | 269/21 |
| 4,475,223 | 10/1984 | Taniguchi et al. | 378/34 |
| 4,504,045 | 3/1985 | Kenbo et al. | 269/21 |
| 4,666,291 | 5/1987 | Taniguchi et al. | 355/52 |
| 4,737,824 | 4/1988 | Sakai et al. | 355/53 |
| 4,788,577 | 11/1988 | Akiyama et al. | 355/53 |

FOREIGN PATENT DOCUMENTS 55-160439 12/1980 Japan ................................ 264/21
62-122126 6/1987 Japan .

Primary Examiner—L. T. Hix
Assistant Examiner—D. Rutledge
Attorney, Agent, or Firm—Kenyon & Kenyon

[57] ABSTRACT

An enlargement projection type exposure method includes the steps of deforming the shape of a substrate so as to eliminate distortion in an enlarged image of the pattern, which is formed on a mask and projected onto the substrate through an enlargement projection system. The pattern is exposed with the use of an enlargement projection optical system. An apparatus for the method comprises an enlargement projection optical system for enlarging the pattern formed on the mask, and a substrate deforming device for deforming by adsorption the substrate in shape so as to eliminate the distortion in the enlarged image of the pattern through the enlargement projection optical system.

46 Claims, 11 Drawing Sheets

F I G. IB
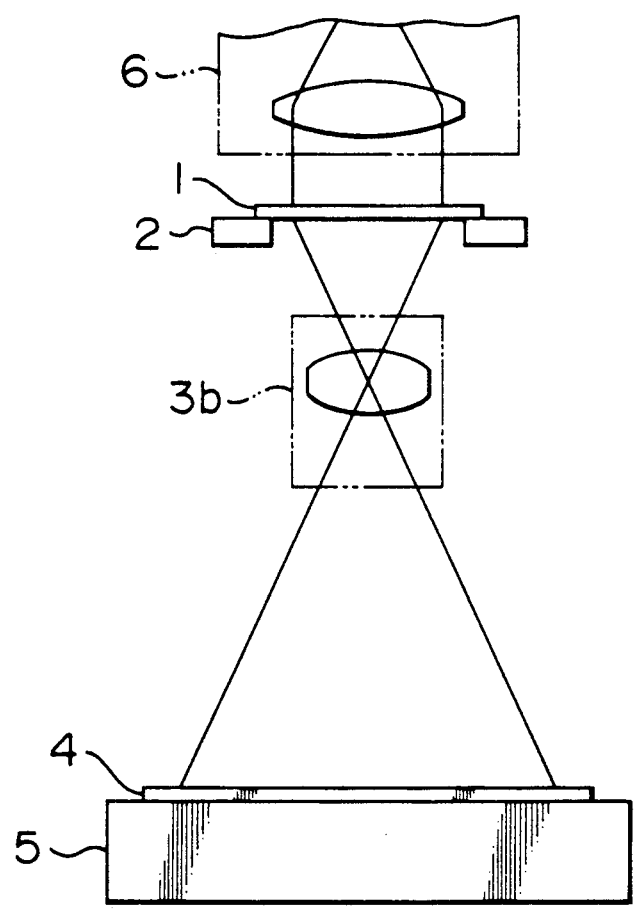

EXPOSURE METHOD AND APPARATUS

BACKGROUND OF THE INVENTION

The present invention relates to an exposure method and an apparatus therefor which is suitable for enlarging and transferring a pattern formed on a mask onto a substrate during the process of manufacturing electronic devices such as a semiconductor, a liquid crystal display element, and the like.

The liquid crystal display element, for example, is thought to be a promising display because of its configuration, which is thinner and smaller than that of an electron tube. A liquid crystal display element of active matrix type which employs thin film transistors (TFT) has been becoming widely used because of its excellent picture quality.

For manufacturing the TFT, it is necessary to use an exposure device performing in substantially the same manner as an exposure device for manufacture of a semiconductor element. Consequently, a proximity method type exposure device and a one-to-one mirror-and-lens-projection method type exposure device are used.

There is the prospect that the size of the display will become as large as the screen of a CRT (cathode-ray tube). If such a large display is actually produced, however, there will arise various problems with the use of existing exposure devices.

The proximity type exposure method has problems when exposing a large area, such as occur in the manufacturing of a large area and high precision mask, high precision detection of a gap between mask and substrate, and reduction of pitch error.

On the other hand, the projection type exposure method, inevitably causes a joint portion in the screen due to its exposing style. This method makes it difficult to attain a high precision and satisfactory electrical characteristic values in the joint portion. Further, since separate exposures are carried out, the throughput is low and it is difficult to reduce the production cost of the device due to its exposing style.

In order to solve the above-described problems of the existing exposure methods, a method can be considered wherein a mask produced by an electronic drawing machine used for manufacturing high precision masks, for example, a semiconductor mask not larger than seven inches, is enlarged through a projection optical system so as to achieve an exposure over a large area. An example of such an enlargement projection type exposure method is disclosed in Japanese Patent Unexamined Publication No. 62-122126, in which a pattern formed on a mask is enlarged through a projection optical system onto a substrate, the projection optical system employing parallel rays on the substrate side thereof.

The optical system used with the enlargement projection type exposure method mentioned above serves to project a pattern as parallel rays onto the substrate side thereof. In an ordinary reduction projection type exposure device used for semiconductors, parallel rays are employed on the projected side or on the wafer side, with the result that there is hardly any shape error with respect to the deviation in the focal direction.

However, it is inevitable that the lens used in the projection optical system will differ from the ideal values even if it is manufactured to high accuracy. Errors include pattern distortion, magnification error and the like. The absolute values of these errors become large in the case of enlargement projection.

For example, even with a lens having a pattern distortion factor of 0.01%, a deformation of 50 μm appears in the periphery on a screen with each side being 500 mm. It is still necessary, therefore, to achieve a smaller value than the above value by one figure because of the accuracy of the superposition among the layers forming the patterns. Further, every lens has its own individual characteristics and it is impossible to manufacture lenses that are identical with one another, so that it is impossible to achieve a superposition of patterns by making use of a plurality of devices. Even if the pattern distortion and the magnification error come out in accordance with each individual lens, it is considerable that, when there is no fluctuation or a very small fluctuation, a single device is used to form patterns throughout the entire process. However, since the relation between the device and the product is limited, there gives rise to a problem that the capability of mass-production is reduced. In addition, in case of achieving an exposure over a still larger area by means of joining patterns together, there is a problem in that superposition is not assured at a joint portion due to deformation.

SUMMARY OF THE INVENTION

An object of the present invention is to provide an exposure method and an apparatus therefor used for transferring a pattern formed on a mask onto a substrate by conducting enlargement projection, which is capable of transferring the pattern with high throughput by correcting for errors due to the optical system.

In order to achieve the above object of the present invention, an exposure method and an apparatus is provided comprising mask positioning means for positioning a mask on which a pattern is formed; substrate positioning means incorporating a plurality of fine displacement generating means for elastically deforming a surface of the positioning means, which can also move up and down and which is adapted to hold by adsorption a substrate thereon; an enlargement projection optical system for projecting the pattern on the mask onto the substrate as non-parallel rays (through a non-telecentric optical system); and an exposure illumination system for illuminating the pattern on the mask.

In the above method and apparatus, it is preferable to make the exposure after the surface of the substrate is deformed and moved vertically on the basis of data concerning the optical errors inherent in the enlargement projection optical system. This data is obtained by detecting and calculating the relative position of the patterns on the mask and the substrate. This data is also obtained by measuring the unevenness in the thickness of the substrate.

It is also preferable that there are provided at least two substrate positioning means, at least one detecting and calculating means for detecting the relative positional deviation between the patterns on the mask and the substrate, and at least one detecting means for detecting the level of the surface of the substrate so as to be operated individually or in parallel.

Further, it is preferable that the substrate positioning means includes moving means and position detecting means.

According to the present invention, after a mask is fixed and positioned to the mask positioning means while a substrate is fixed and positioned to the substrate positioning means, the mask is illuminated by the exposure illumination system so that a pattern formed on the mask is projected and enlarged onto the substrate with the use of the enlargement projection system which employs non-parallel rays on the substrate side thereof (a non-telecentric optical system). Then, the pattern on the reference mask is transferred onto the substrate so as to obtain measurements of the differences in the shape and the magnification between the mask pattern and the transferred pattern. Based on data concerning these differences, the fine displacement generating means incorporated in the substrate positioning means for elastically deforming the surface of the substrate are driven, while the substrate positioning means is as a whole moved vertically, thereby making correction correcting for the differences between the pattern shape and magnification for the transferred pattern and the design values.

According to the above method, the exposure is performed while effecting absolute value control in such a manner that the pattern distortion and magnification error caused by the enlargement projection system which were calculated beforehand by conducting pre-exposure tests, are compared with the design values therefor, and the errors obtained as a result of such a comparison are corrected by deforming and vertically moving the surface of the substrate.

It is also possible to perform the exposure while effecting relative value control in such a manner that the relative positional deviation between the mask pattern projected onto the substrate and the pattern formed on the substrate is detected by the position detecting and calculating means so as to calculate the differences between the mask pattern and the substrate pattern. Based on the data concerning these differences, the fine displacement generating means incorporated in the substrate positioning means are driven while the substrate positioning means is as a whole moved vertically so as to achieve alignment between the mask pattern and the subtrate pattern.

Additionally, it is possible to perform an exposure while making corrections in such a manner that the level of the surface of the substrate is detected by level detecting means so as to calculate differences between the detected level and the reference level. Also, the distortion and magnification error of the mask pattern projected onto the substrate which is attributable to the unevenness in the thickness of the substrate and to the difference in the absolute thickness of the substrate, are corrected by the substrate positioning means in the same manner as described above.

By providing at least two substrate positioning means, at least one exposure illumination system, at least one position detecting and calculating means, and at least one substrate surface level detecting means, different operations can be carried out simultaneously on the substrate positioning means, thereby assuring a high throughput on the exposure apparatus.

It is possible to sequentially expose a pattern of a single mask to one substrate while moving horizontally the substrate positioning means by exactly the desired distance with the use of the moving means and position detecting means. It is also possible to form a pattern of a large area by conducting the exposure while replacing a plurality of masks mutually related to each other and while moving the substrate.

Alignment between the pattern for the mask and the pattern formed on the substrate can be achieved by the position detecting and calculating means for detecting the relative position of these two patterns, so that it is possible to superimpose exposures with the use of a plurality of masks in a given order.

BRIEF DESCRIPTION OF THE DRAWINGS

FIG. 1B is a view of a modification of the embodiment shown in FIG. 1A;

DETAILED DESCRIPTION

Figure 1A:
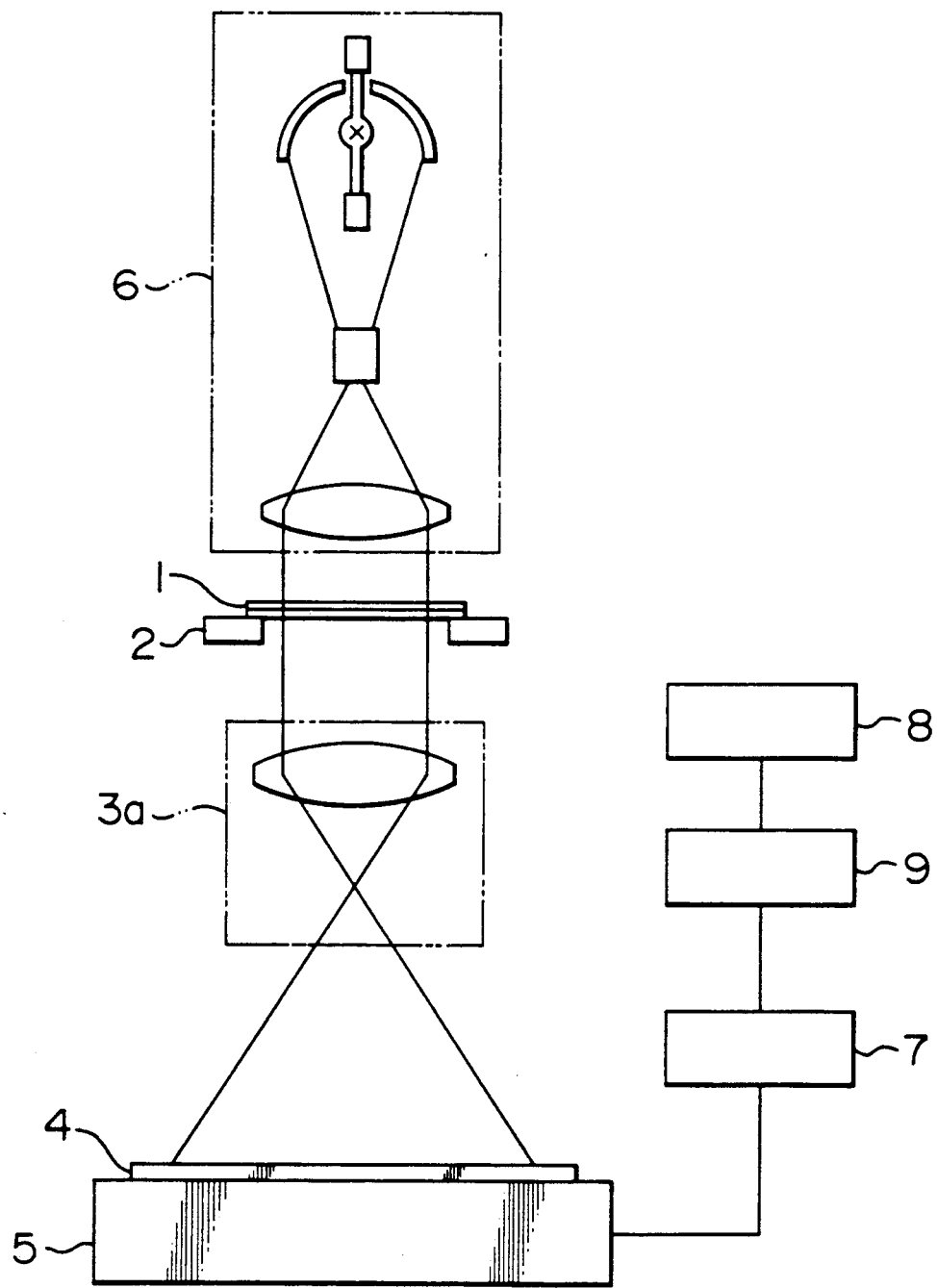
FIG. 1A is a view an exposure apparatus in accordance with an embodiment of the present invention.

An embodiment of the present invention will be described below with reference to the drawings. FIG. 1A shows the arrangement of essential portions of an embodiment of the present invention. An exposure apparatus according to this embodiment includes a mask 1, a mask holder 2, a magnifying lens 3a, a substrate 4 on which a pattern formed on the mask 1 is projected, a substrate chuck 5, and an exposure illumination system 6 for illuminating the mask 1 and exposing, through the magnifying lens 3a, a photo-resist applied to the surface of the substrate 4. An actuator, which will be described later, is connected to the substrate chuck 5 for driving the same, the actuator includes a driver 7 which and a computer 8 for controlling the driver 7 are connected to each other through an interface 9. In this embodiment, the magnifying lens 3a serves as a non-telecentric optical system to project the pattern on the mask 1 onto the substrate 4.

In the embodiment shown in FIG. 1A, the pattern on the mask 1 is projected onto parallel rays to the magnifying lens 3a (using a telecentric optical system). Alternatively the pattern may be projected through an aperture (using a non-telecentric optical system) as is the case of a modification shown in FIG. 1B. In this modification, the magnifying lens 3b can be made smaller in diameter as compared with the lens in the embodiment shown in FIG. 1A. It is also possible to correct an error in the magnification of the magnifying lens 3, which will be described later, by moving the mask 1 up and down.

Figure 2:
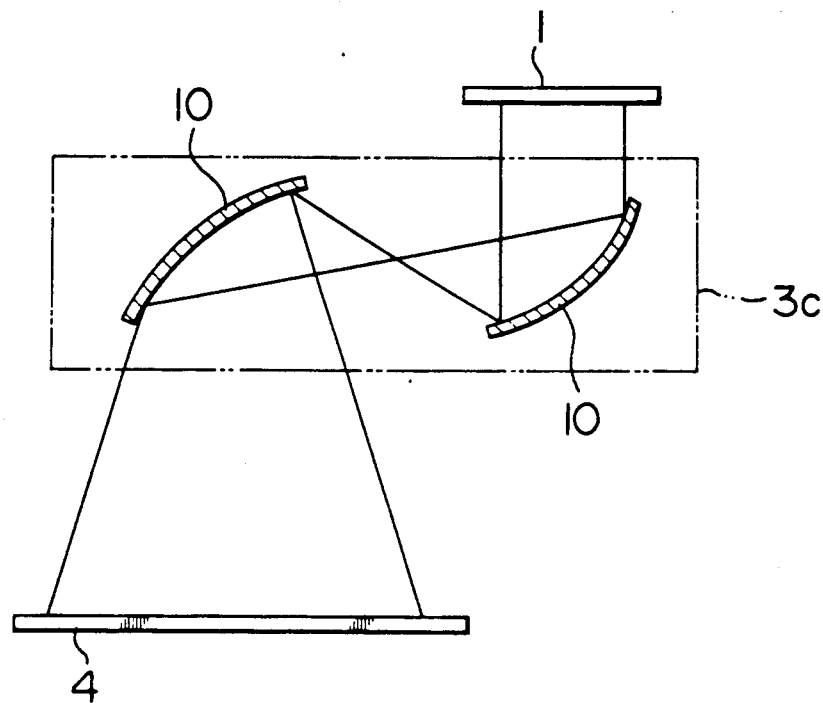
FIG. 2 is a view of another modification of the embodiment of FIG. 1 in which an enlargement optical system different from that shown in FIG. 1 is used.

Incidentally, although the enlargement projection comprises systems lens systems in the embodiments shown in FIGS. 1A and 1B, it may comprise a reflection optical system including ellipsoid mirrors 10 as indicated by a reference numeral 3c in FIG. 2.

Figure 3:
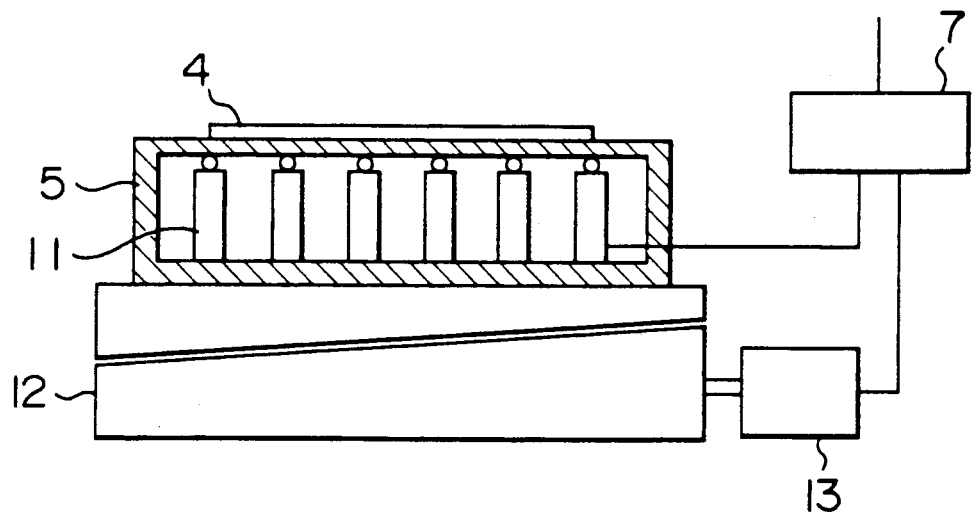
FIG. 3 is a sectional view of a substrate chuck used in the embodiment shown in FIG. 1A.

FIG. 3 shows a driving system for the substrate chuck 5. Various substrate chucks have been disclosed in U.S. Pat. Nos. 4,475,223, 4,391,511, 4,504,045, 4,666,291 and 4,788,577. The disclosure of these patents is hereby specifically and totally incorporated herein by reference. The substrate chuck 5 has a plurality of fine displacement generating devices 11, such as piezoelectric elements, so that the surface thereof is elastically deformed. The piezoelectric elements 11 are each pressed at their tips against a surface board of the substrate chuck 5 so as to support the chuck from the back thereof. Alternatively, any fine displacement generating means can be employed as long as it is capable of giving a fine vertical displacement to the surface board of the substrate chuck 5. In addition, the unit described above is designed to be vertically movable as a whole by driving a vertically movable device, such as a wedge Z-stage 12, by means of a motor 13. It is noted here that the piezoelectric elements 11 and the motor 13 are connected to the driver 7.

Incidentally, if the amplitude of the displacement of the piezoelectric elements 11 in the upper unit is long enough, it is possible to omit the Z-stage 12.

In the arrangement described above, when the pattern on the mask 1 is projected through the magnifying lens 3 onto the substrate 4, the projected image cannot always be obtained in an undistorted shape and with a uniform magnification.

The reason for this will now be described with reference to FIGS. 4A and 4B.

Figure 4A:
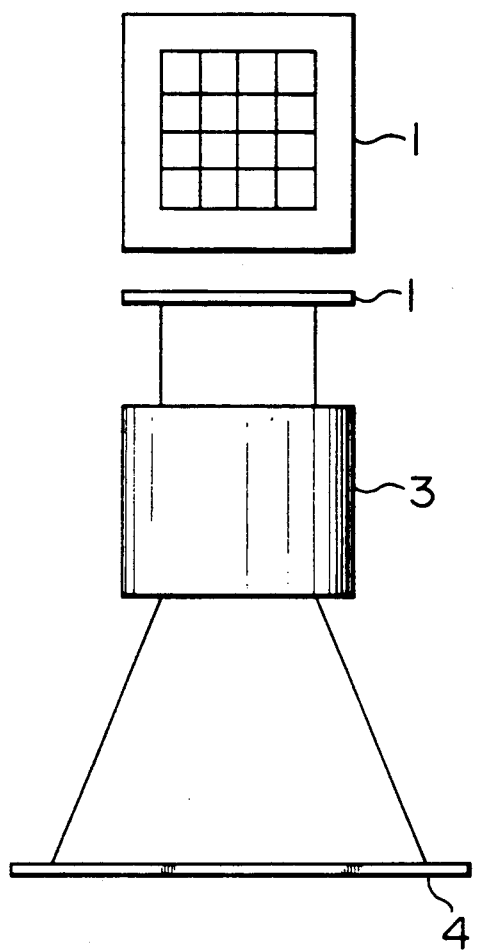
FIGS. 4A and 4B are views showing optical errors in a projected pattern caused by magnifying lens.
Figure 4B:
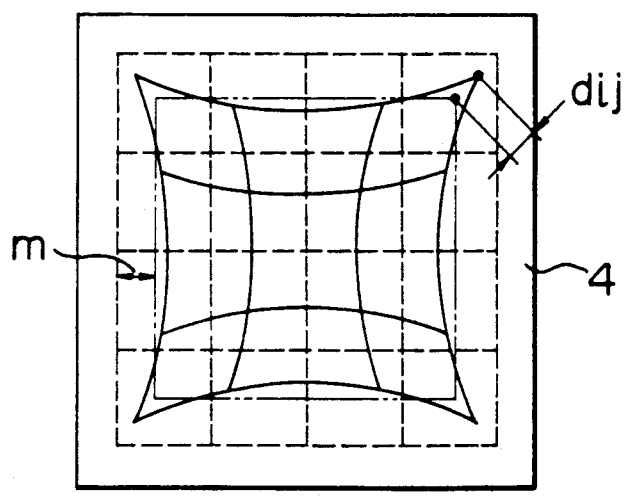

FIGS. 4A and 4B show an example of pincushion distortion which is a typical error attributable to an optical lens. This is caused by an image formation where four corners of the image are magnified and the central portion of each side of the image is reduced in magnification. For example, when a lattice pattern on the mask 1 is projected through the magnifying lens 3 onto the substrate 4, as shown in FIG. 4A, provided that no error results, the lattice is properly projected with the regular magnification without causing any distortion, as indicated by the broken lines in FIG. 4B. In practice, however, magnification errors appear as both the difference in size of the whole image and pattern distortion appearing as a change in the shape of the pattern, as indicated by the solid lines in FIG. 4B.

In order to correct for the optical error when a reduction projection type exposure apparatus is used in which the bundle of rays on the projecting side are made to pass as parallel rays (using a telecentric system), the correction for the magnification error is made by moving a reticle (mask) up and down with respect to the optical axis of the reducing lens, while the correction for keystone distortion is made by inclining the reticle (mask) or the reducing lens. In the optical system through which parallel rays are made to pass, the above-described distortion of the shape is correctable.

But there are some cases where the typical distortion attributable to the optical lens, which is shown in FIGS. 4, cannot be corrected even if the reticle (mask) or the optical system is inclined.

The degree of distortion in an enlarged projection system will now be estimated. Assuming a pattern having each side 100 mm long (a t-inch mask) is enlarged by a magnification of five through the magnifying lens 3, a deformation of 25 $\mu$m appears on the substrate even when the degree of distortion attributable to the magnifying lens 3 is 0.005%. This value of deformation is larger by one figure or more as compared with the accuracy of the superposition required among the layers of a superposed pattern, when the pattern is intended to produce a liquid crystal display element of active matrix type. This values results in the inability of correcting for such distortion. This is a fatal problem in manufacturing products.

Energy lens has its own individual differences so that the shape, and the amount of distortion as well differ from one lens to another. For this reason, it is almost impossible to achieve the superposition of patterns with the use of a plurality of appartuses.

The present invention has been developed to solve the above-described problems. As shown in the embodiments of FIGS. 1 to 3, the pattern on the mask 1 is projected through the non-telecentric optical system onto the substrate 4, and the surface of the substrate 4 can be deformed and moved up and down.

A description will be given of how to correct for the errors shown in FIGS. 4A and 4B, in accordance with the present invention. First, a pattern on the reference mask 1 is projected onto the substrate 4 through the magnifying lens 3. Then, the differences in the resulting projected pattern from the desired design values (indicated by broken lines in FIG. 4B) are calculated so as to obtain a difference m in the overall size and differences dij at various points on the pattern as indicated by the two dot chain line in FIG. 4B.

In order to obtain these differences, the absolute values of the dimensions of the pattern imaged on the substrate are measured, (with an optical measuring device for example) and are compared with the design values in order to obtain the differences therebetween.

Figure 5:
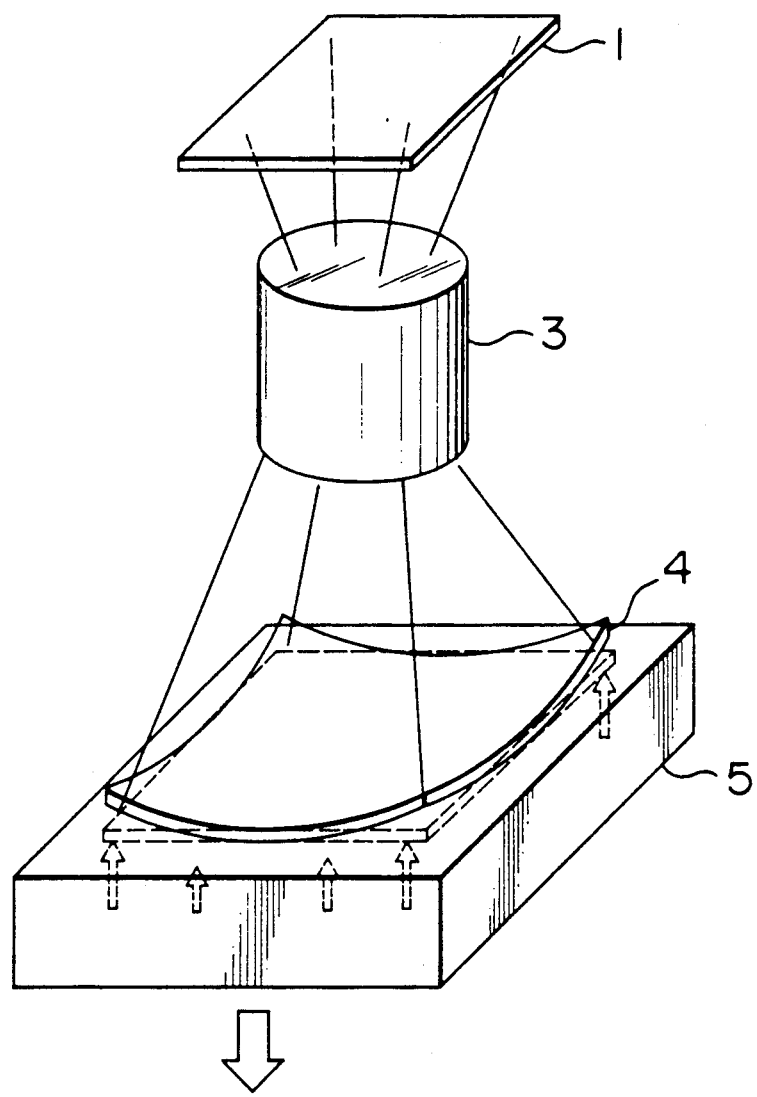
FIG. 5 is a perspective view illustrating a method for correcting the optical errors shown in FIG. 4.

FIG. 5 shows how to correct for the errors shown in FIG. 4B. More particularly, the error due to low magnification is corrected by moving downward the Z-stage (designated by the reference numeral 12 but not shown in this drawing) of the substrate chuck 5. Also, the error due to the pincushion distortion is corrected by driving the piezoelectric elements, designated by the reference numeral 11 FIG. 3 but also not shown in this drawing, of the substrate chuck 5 such as to cause piezoelectric elements disposed at the four corners to be displaced much more than the elements at other locations as indicated by the length of the broken-line arrows in FIG. 5.

Next, a description will be given of how to correct for the unevenness of in the thickness of the substrate 4. In the optical system according to the present invention, the difference in the thickness among the substrates, that is, the difference in their absolute value, leads to magnification error, while the unevenness of thickness in the each substrate results in pattern distortion.

Figure 6:
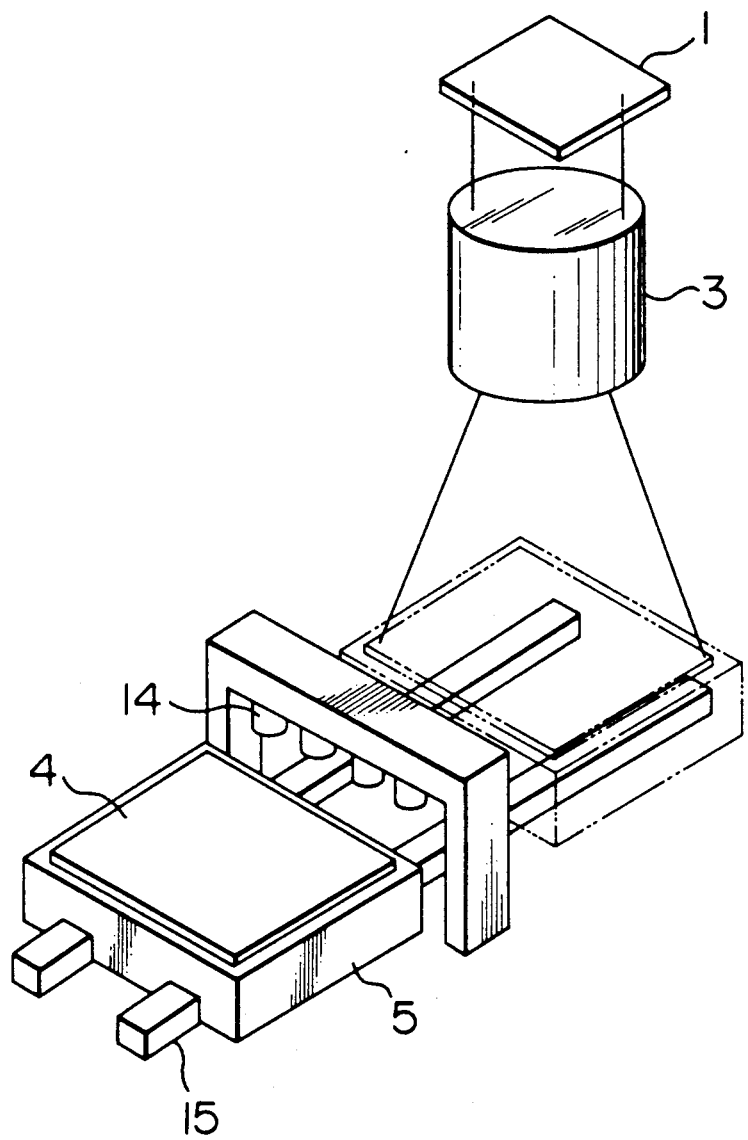
FIG. 6 is a perspective view showing an arrangement of an exposure apparatus in accordance with another embodiment of the present invention which further comprises a substrate surface level measuring system.

FIG. 6 shows another embodiment of the present invention in which a system for measuring the thickness of the substrate 4 is provided. The principal arrangement of this embodiment is identical with the embodiment shown in FIGS. 1 to 3. Further, in this embodiment, measuring devices for measuring the level of the surface of the substrate 4, (in other words, the absolute values of the thickness and the unevenness in the surface) are provided. These measuring devices may be air micrometers 14, the substrate chuck 5 includes a substrate chuck travel system 15 so that the chuck 5 can travel under the air micrometers 14 to a position just below the magnifying lens 3. With the arrangement described above, the level of the surface of the substrate is measured at a plurality of predetermined measuring points while the substrate chuck 5 is moved under a plurality of air micrometers 14. This measuring method is also shown in U.S. Pat. No. 4,788,577. The disclosure of this patent is hereby specifically and totally incorporated herein by reference.

Figure 7:
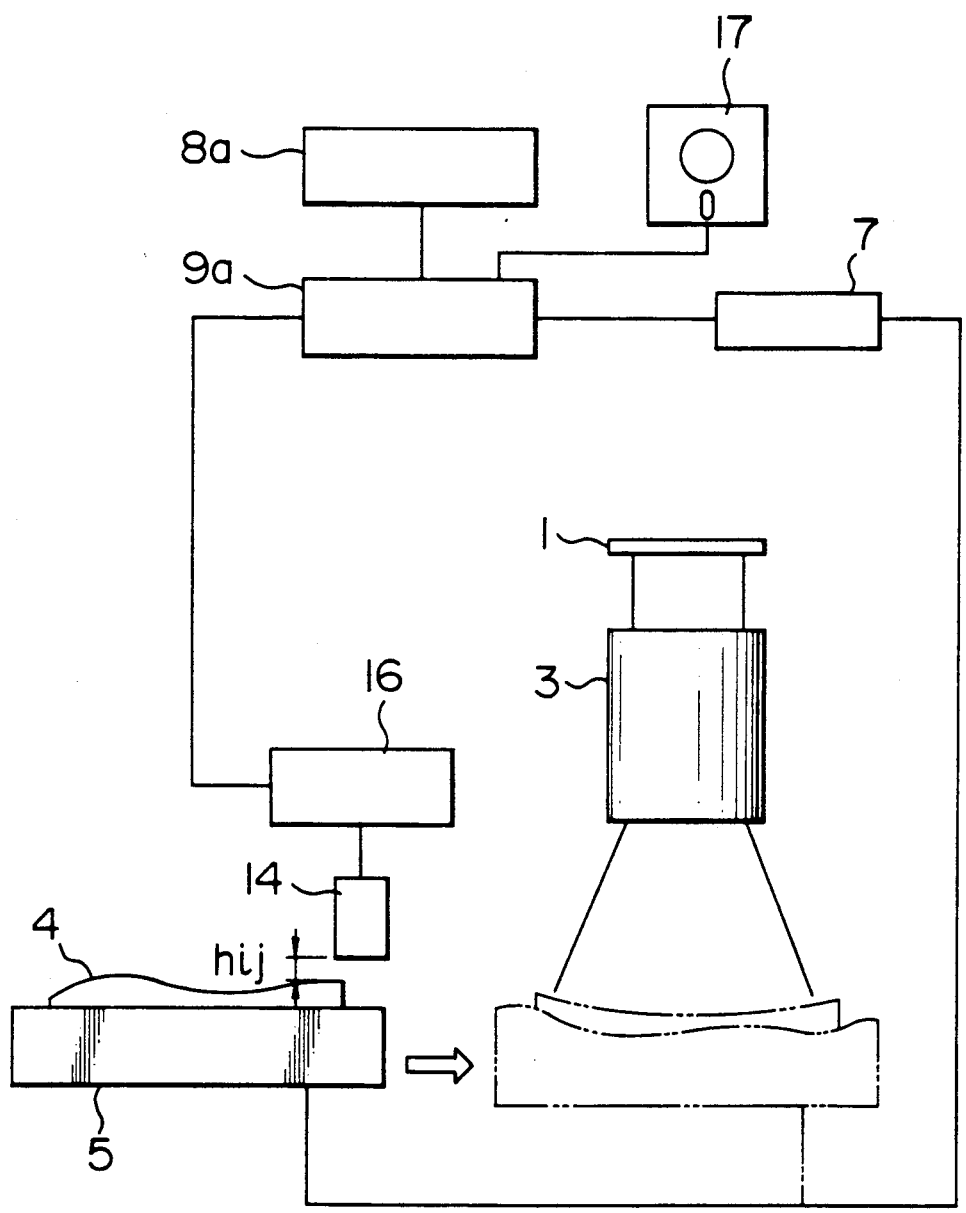
FIG. 7 is a view of a system used in the embodiment shown in FIG. 6, in which the exposure is conducted after correcting for the surface level of the substrate.

FIG. 7 shows a block diagram for explaining the exposure method, in which the thickness of the substrate 4 is taken into consideration. The thickness hij of the substrate 4 is detected at a plurality of points by means of the air micrometers 14. These detected values are fed through a transducer 16, such as a pressure transducer and A/D converter, and through an interface 9a, into a computer 8a. The computer 8a makes calculations for the respective points based on the thickness hij of the substrate 4 and data 17 containing the errors of magnifying lens 3 (that is, the magnification error m, the pattern distortion dij and the like, which have been obtained as shown in FIG. 4), thereby obtaining control values of the surface level of the substrate 4. Subsequently, based on the data thus obtained, the piezoelectric elements (designated by the reference numeral 11 but not shown in FIG. 7) of the substrate chuck 5 and the Z-stage (designated by the reference numeral 12 but not shown in FIG. 7) are driven. Thus, it is possible to project an ideal pattern on the substrate 4 without being affected by the errors of the magnifying lens 3 and the unevenness in the thickness of the substrate 4.

The foregoing has described the exposure method used in the embodiments of the invention shown in FIGS. 1 to 7, wherein the design values are used as a reference for the control based on the design values (absolute values). Next, a description will be given of another embodiment of the present invention wherein an exposure method is employed which makes use of the mask as a reference.

Figure 8A:
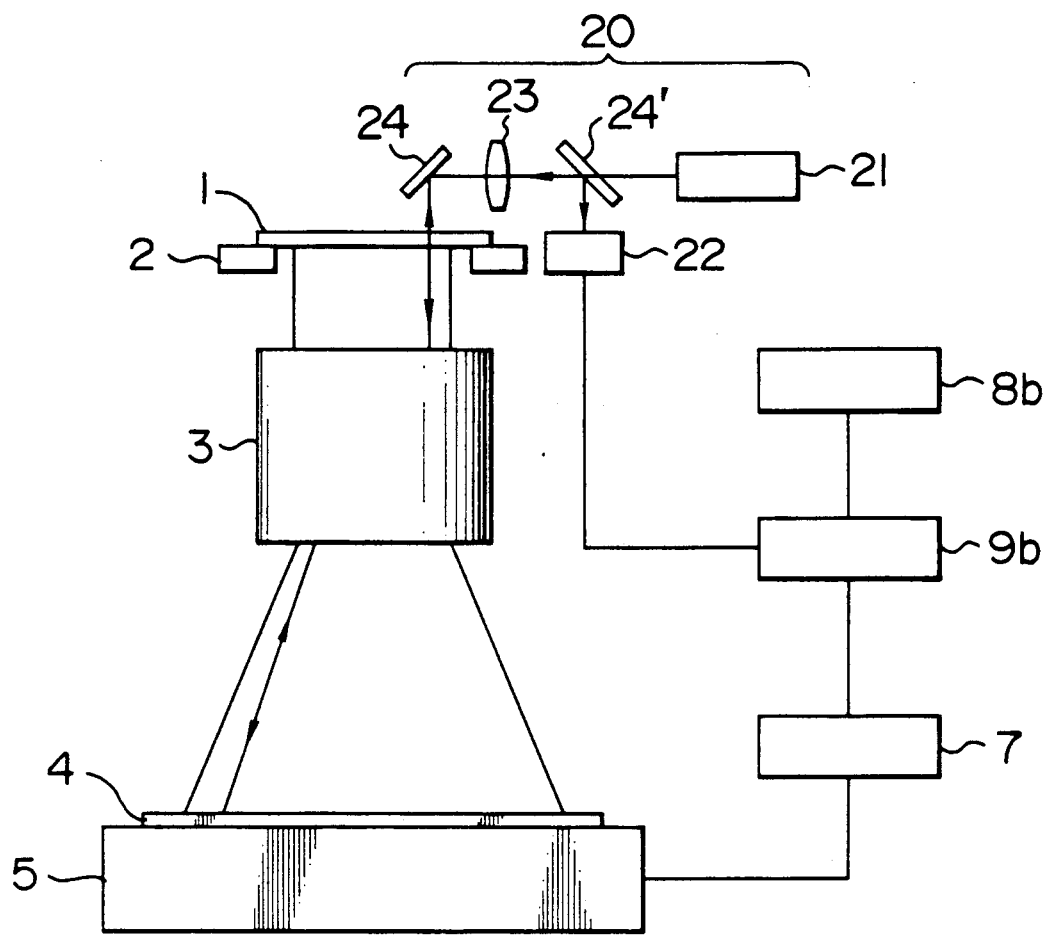
FIGS. 8A and 8B are a view of an exposure apparatus in accordance with another embodiment of the present invention, which comprises a system for conducting the exposure while aligning the mask and the substrate, and an illustration showing the pattern on the substrate, respectively.
Figure 8B:
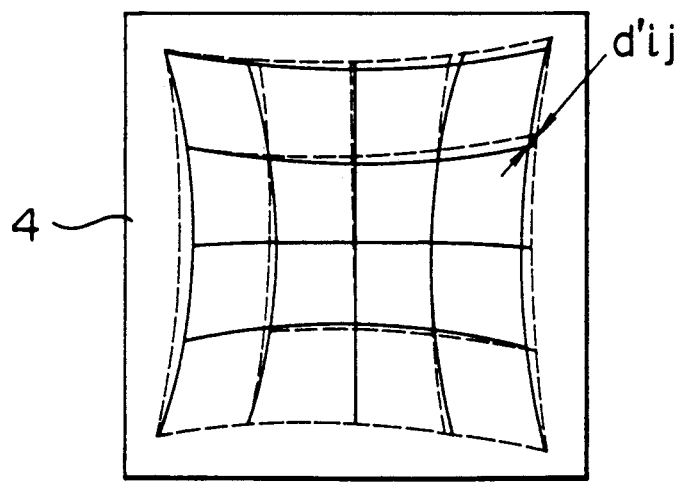

FIG. 8 shows an embodiment in which the exposure method is employed which makes use of the mask as a reference for registration. In this embodiment, in addition to the basic construction which is identical with that of the above described embodiments, a relative position detection system 20 is provided for detecting the relative position of the pattern on the mask 1 and the corresponding pattern on the substrate 4.

The relative position detection system 20 includes an illumination light source 21 for emitting light which is of a wavelength incapable of sensitizing a resist on the substrate, a detector 22 for detecting the patterns on the mask 1 and the substrate, a lens 23, and mirrors 24, 24' for transmitting the positional relation therebetween. Output from the detector 22 is allowed to be fed through an interface 9b into a computer 8b.

With the arrangement described above, as the relative position detection system 20 is moved, differences d'ij between the corresponding patterns on the mask 1 and the substrate 4 (see FIG. 8B) are detected at a plurality of predetermined points. Then, the piezoelectric elements (designated by the reference numeral 11 but not shown in this drawing) incorporated in the substrate chuck 5 and the Z-stage (designated by the reference numeral 12 but not shown in this drawing) are driven so as to make the differences d'ij zero.

The mask 1 reference registration type exposure method described above is carried out in a superpostion of exposure performed on the second and subsequent layers. In exposing the first layer, the pattern on the mask 1 is projected onto the substrate 4 without making a correction for the errors of the magnifying lens. The above-mentioned deformation of 25 μm in the case of a fractional pattern distortion of 0.005% appears only as a very small value on the display and accordingly cannot be identified with human eyes. It is therefore unnecessary to correct for such distortion.

By using the relative position detection system 20 described above in combination with the embodiments shown in FIGS. 1 to 7, which employ the design value reference type exposure method, it is possible to superpose various patterns so as to form the liquid crystal display element or the like. More specifically, the shape and the magnification of each of the patterns to be superperposed are corrected on the basis of the design value reference, and then, the relative position of the patterns on the mask 1 and the substrate 4 is detected at least at two points by making use of the relative position detection system 20. Subsequently, the substrate 4 and 1 or the mask 1 are moved such that the detected relative position of the patterns thereon are made to satisfy a predetermined relation, thereby achieving complete alignment between the pattern on the mask 1 and the pattern on the substrate 4. By making such exposures repeatedly with the use of different masks 1 one at a time, the pattern for the liquid crystal display element can be made up. Usually, when performing such an alignment, alignment marks are provided on the mask 1 and the substrate 4 which are detected by making use of the relative position detection system 20 and the gap therebetween is fed back to the X-, Y- and Z-stages (not shown) of the substrate chuck 5 to thereby achieve alignment.

Although a description has been given in the foregoing of cases where the pattern of the mask 1 is formed over the entire surface of the substrate 4, there also will be described another case where the pattern of the mask 1 is formed a plurality of times on a substrate 4 having a larger area. It is assumed, in the case to be described below, that only the area of the substrate 4 is increased; the size and the specification of the mask 1 and the magnifying lens 3 are unchanged.

Figure 9A:
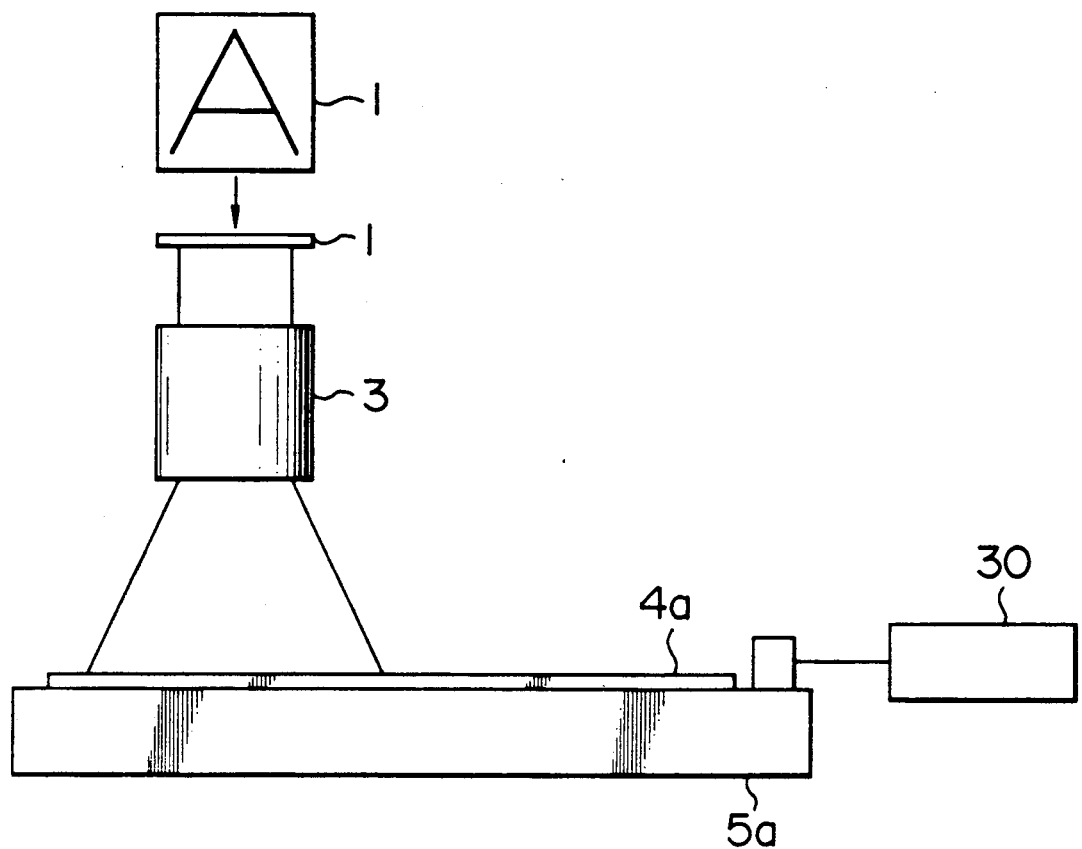
FIGS. 9A and 9B are views of a modification of the embodiment shown in FIG. 1A for use when a single pattern is formed a plurality times.
Figure 9B:
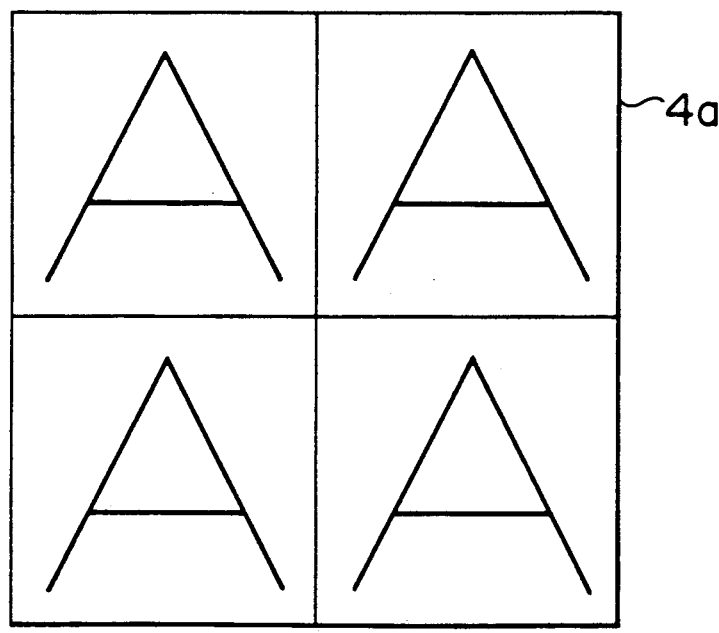

FIG. 9B shows an example of the above case. In this example, however, the substrate chuck 5a is also enlarged along with the increase in area of a substrate 4a. In addition, the substrate chuck 5a can move freely in the X- and Y-directions. A device such as a laser measuring device 30 is provided for measuring the amount of movement of the substrate chuck 5 to ensure that the alignment is performed with high accuracy. In this example, a single mask is used to form a plurality of the same pattern on the surface of a substrate, as shown in FIG. 9B. It is noted that, prior to making the exposure, the projected pattern is corrected on the basis of the design value reference, or the mask reference as is the case in each of the aforementioned embodiments. In the illustrated case, the pattern on the mask 1 is used to form the same pattern four times on the substrate 4a. It is also possible to form the same pattern many more times, if the substrate chuck 5a is further enlarged and the extent of the movement thereof is made longer.

Figure 10A:
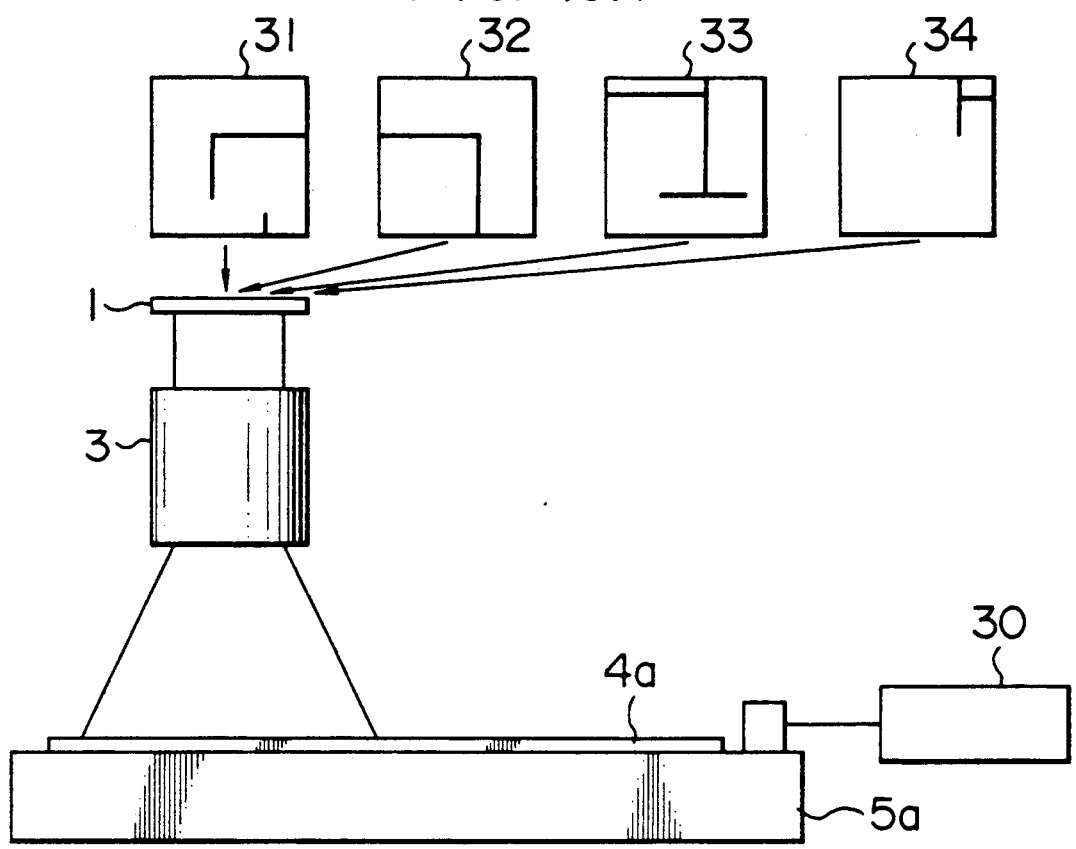
FIGS. 10A and 10B are views of a modification of the embodiment shown in FIG. 9 for use when a pattern for a wide screen is formed by means of joining together differing patterns.
Figure 10B:
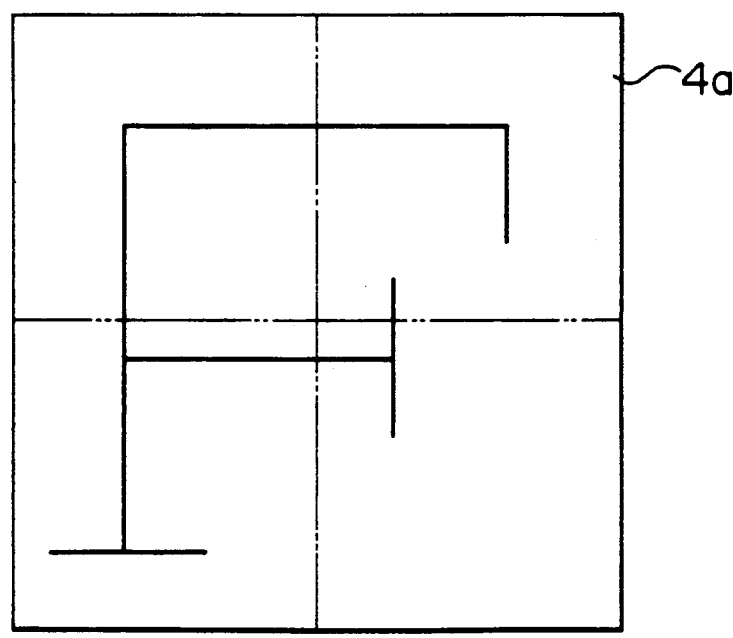

FIG. 10 shows a modification of the embodiment shown in FIG. 9B, in which the masks 1, the patterns on which are different from each other, are joined with each other to form a single large product on the substrate 4a. In this case, the pattern on a first mask 31 is first formed on the left upper-half portion of the substrate 4a. Then, the first mask 31 is replaced by a second mask 32 and the substrate chuck 5a is moved so that a right upper-half portion of the substrate 4a is brought to the position under the magnifying lens 3. In this position, the pattern on the second mask 32 is projected on the substrate 4a. Subsequently, the patterns on a third mask 33 and a fourth mask 34 are projected on the substrate 4a in the same manner while the substrate chuck 5a is moved, thereby making it possible to form a single, united pattern for a large product on the substrate 4a, as shown in FIG. 10B. In this embodiment, the pattern on the four masks 31 to 34 are joined with each other on the substrate 4a. It is also possible to form a larger product, if the substrate chuck 5a is further enlarged and the extent of the movement thereof is made longer.

Figure 11A:
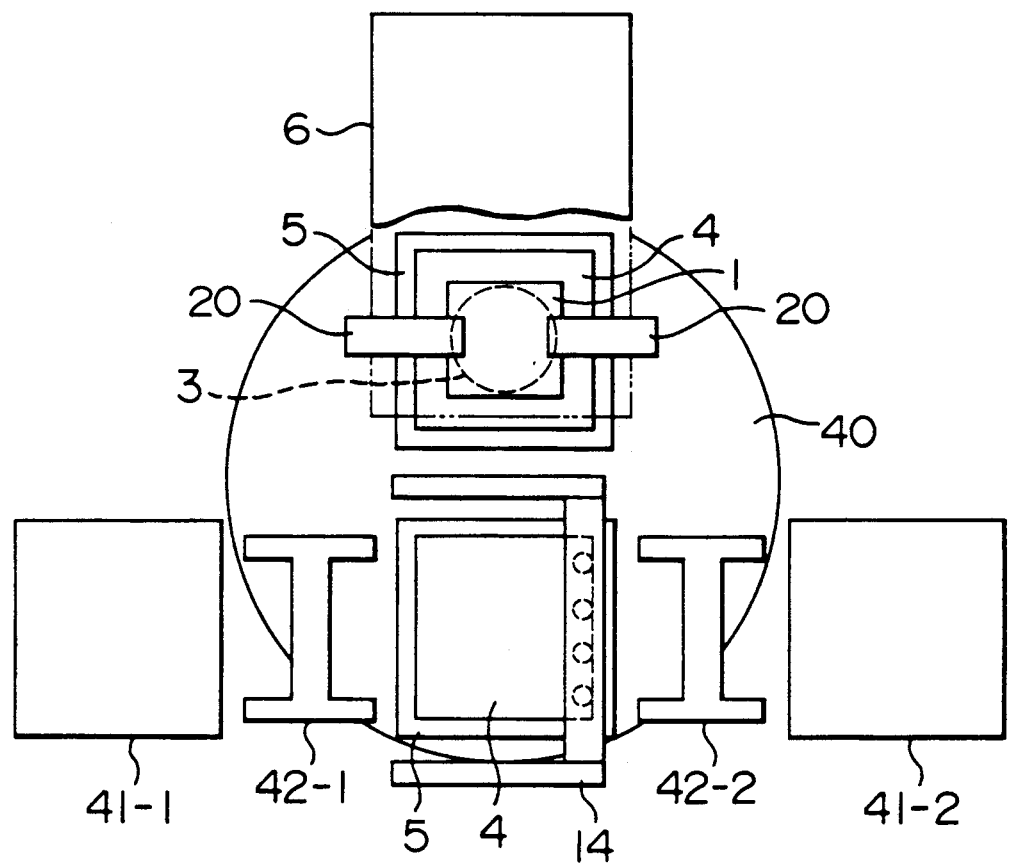
FIGS. 11A and 11B are a plan view and a front view, respectively, showing an example of the complete arrangement of an exposure machine according to the present invention.
Figure 11B:
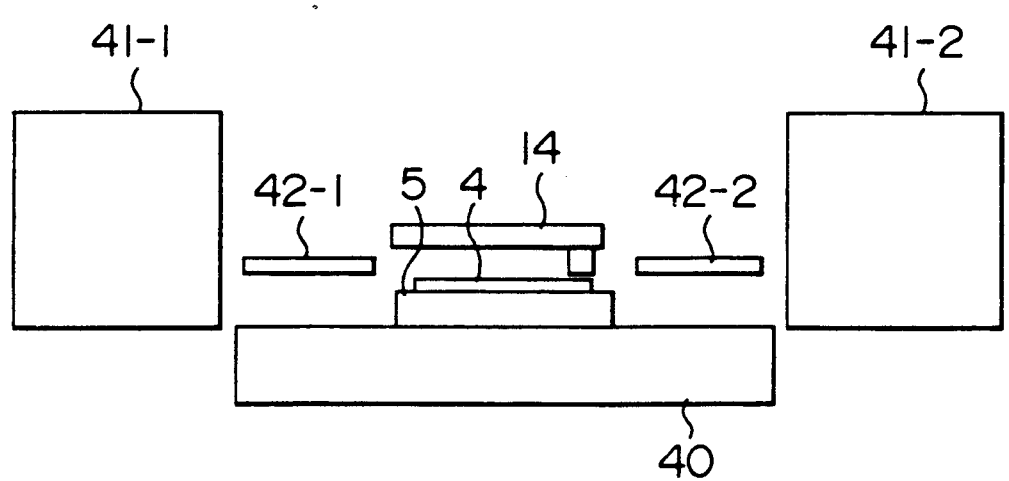

FIGS. 11A and 11B show the detailed construction of the exposure machine according to the present invention. The exposure machine comprises a rotary index table 40, two substrate chucks 5 disposed on the table 40, air micrometers 14 for measuring the level of the substrate surface, mask holder means (not shown) for positioning the mask 1, the magnifying lens 3, the relative position detection system 20, the exposure illumination system 6, substrate cassettes 41 for receiving the substrate 4, and carriages 42 serving to allow the substrate 4 received in the substrate cassette 41 to be loaded and unloaded on the substrate chuck 5.

With the construction described above, the substrate 4 is transferred from the substrate cassette 41-1 onto the substrate chuck 5 by means of the carriage 42-1. Then, the air micrometers 14 are made to travel so as to measure the level of the surface of the substrate 4. Upon completion of the above operations, the table 40 is rotated through an angle of 180° so as to move the substrate chuck 5 on which the substrate 4 is loaded to the position under the magnifying lens 3. In this state, a new substrate 4 is transferred from the substrate cassette 41-1 onto another substrate chuck 5, which is not under the magnifying lens 3, and the level of the surface of the new substrate 4 is measured by means of the air micrometers 14. Meanwhile, the substrate 4 under the magnifying lens 3 is aligned with the mask 1 by means of the relative position detection system 20 and, thereafter, ultraviolet rays produced by the exposure illumination system 6 are irradiated so as to project the pattern on the mask 1 onto the substrate 4. Incidentally, prior to the exposure, the substrate chuck 5 has been corrected by driving the piezoelectric elements (designated by the reference numeral 11 but not shown in this drawing) and the Z-stage (designated by the reference numeral 12 but not shown in this drawing) so as to prevent any distortion or magnification error from appearing on the pattern to be formed.

After completing the exposure, the table 40 is rotated through 180° so that the substrate 4 that has been exposed is received in the substrate cassette 41-2 by means of the carriage 42-2.

With the construction described above, it is possible to carry out the operations for measuring and correcting the level of the surface of the substrate 4 simultaneously with the operation for ensuring the registration between the mask 1 and the substrate 4 and the exposure.

As has been described in the foregoing, according to the present invention, since the pattern on a mask can be enlarged on a substrate, it is possible to form a high precision pattern of larger area by using a relatively small mask such as a mask drawn with the use of an electronic drawing machine or a mask obtained as a copy. Consequently it is possible to manufacture high precision devices such as active matrix type liquid crystal display elements, the size of which can be enlarged remarkably. This contributes to a reduction in the cost of the mask, enhancement in the throughput of the apparatus, and an improvement in productivity.

Additionally, the pattern to be projected on the substrate can be of any desired shape even though it is very small, so that it is possible to correct for the pattern distortion and magnification error, which are serious problems in projection type exposure systems, particularly in enlargement projection type exposure systems, thereby making it possible to establish interchangeability between the apparatuses. This also contributes to an improvement in productivity.

Additionally, the magnifying lens is used in a non-telecentric optical system, so that its diameter can be smaller than the magnifying lens used to project over the same area with the use of parallel rays (as in the telecentric optical system), thereby making it easier to manufacture the lens. This makes it possible to reduce the cost of the lens and thus the cost to manufacture the apparatus is reduced.

In addition, the apparatus comprises at least two substrate chucks, at least one magnifying lens, at least one exposure illumination system and at least one substrate surface level detection system, so that a plurality of operations can be carried out simultaneously, thus making it possible to enhance in the throughput of the apparatus. This enhancement also contributes to an improvement in productivity.

What is claimed is:

1. An enlargement projection type exposure method comprising the steps of:
    a. projecting a circuit pattern of a mask through a lens system onto a substrate before exposure to form a pattern;
    b. comparing the projected pattern on the substrate with design values therefor;
    c. measuring an image distortion of the projected circuit pattern inherent in the lens system;
    d. storing the measured image distortion in means for storing;
    e. calculating control deviations of a surface level of the substrate to correct the measured image distortion stored in the storing means;
    f. generating a fine displacement to elastically deform a shape of the substrate in accordance with the calculated control deviations; and
    g. exposing the circuit pattern of the mask onto the substrate by projecting and enlarging the pattern through the lens system.

2. The enlargement projection type exposure method of claim 1 further comprising the step of displacing at least one of the substrate and the mask relative to the other along an optical axis of the lens system in accordance with the calculated control deviations.

3. The enlargement projection type exposure method of claim 2 further comprising the steps of:
   a. measuring an image magnification error of the projected circuit pattern inherent in the lens system after the step of comparing the projected pattern with design values therefor;
   b. storing the image magnification error in means for storing; and
   c. calculating said control deviations of a surface level of the substrate by means for calculating so as to correct both the image distortion and the image magnification error measured and stored in the storing means.

4. The enlargement projection type exposure method of claim 2 wherein the lens system comprises a non-telecentric enlargement projection optical system.

5. The enlargement projection type exposure method of claim 3 wherein the lens system comprises a non-telecentric enlargement projection optical system.

6. The enlargement projection type exposure method of claim wherein said means for storing comprises an electronic data storage device.

7. The enlargement projection type exposure method of claim 1 wherein said step of generating a fine displacement comprises controlling a plurality of piezoelectric elements with a driver.

8. The enlargement projection type exposure method of claim 2 wherein said step of displacing comprises operating a wedge z-stage.

9. An enlargement projection type exposure method for exposing a second circuit pattern onto a corresponding first projected circuit pattern already formed on a substrate, said method comprising the steps of:
   a. projecting a second circuit pattern of a second mask through a lens system onto the substrate before exposure to form a pattern;
   b. comparing the second projected pattern on the substrate with design values therefor;
   c. measuring an image distortion of the second projected circuit pattern of the second mask inherent in the lens system;
   d. storing the measured image distortion in means for storing;
   e. detecting relative displacement errors between the second circuit pattern of the second mask and the corresponding first projected circuit pattern already formed on the substrate at a plurality of predetermined points by a relative position detection system, said relative displacement errors being in a direction perpendicular to an optical axis of the lens system;
   f. calculating control deviations of a surface level of the substrate to correct the image distortion measured and stored in the storing means as well as to correct the relative displacement errors;
   g. generating a fine displacement to elastically deform a shape of the substrate in accordance with the calculated control deviations; and
   h. exposing the second circuit pattern of the second mask onto the substrate by projecting and enlarging the pattern through the lens system.

10. The enlargement projection type exposure method of claim 9 further comprising the step of displacing at least one of the substrate and the mask relative to the other along an optical axis of the lens system in accordance with the calculated control deviations.

11. The enlargement projection type exposure method of claim 10 further comprising the steps of:
   a. measuring an image magnification error of the second projected circuit pattern inherent in the lens system after the step of comparing the second projected pattern with design values therefor;
   b. storing the image magnification error in means for storing; and
   c. calculating said control deviations of a surface level of the substrate by means for calculating so as to correct both the image distortion and the image magnification error measured and stored in the storing means.

12. The enlargement projection type exposure method of claim 9 wherein the lens system comprises a non-telecentric enlargement projection optical system.

13. The enlargement projection type exposure method of claim 11 wherein the lens system comprises a non-telecentric enlargement projection optical system.

14. The enlargement projection type exposure method of claim 9 wherein said means for storing comprises an electronic data storage device.

15. The enlargement projection type exposure method of claim 9 wherein said step of generating a fine displacement comprises the step of controlling a plurality of piezoelectric elements with a driver.

16. The enlargement projection type exposure method of claim 10 wherein said step of displacing comprises operating a wedge z-stage.

17. An enlargement projection type exposure apparatus comprising:
   a. a lens system projecting a circuit pattern of a mask through the lens system onto a substrate before exposure to form a pattern;
   b. a measuring device measuring an image distortion of the projected circuit pattern of a mask inherent in the lens system, the projected circuit pattern on the substrate being compared with design values therefor;
   c. means for storing the image distortion measured by said measuring device;
   d. means for calculating control deviations of a surface level of the substrate so as to correct the image distortion measured and stored in the means for storing;
   e. a positioning system including means for generating a fine displacement to elastically deform a shape of the substrate in accordance with the control deviations calculated by said calculating means; and
   f. means for exposing the circuit pattern of the mask onto the substrate by projecting and enlarging the pattern through the lens system.

18. The enlargement projection type exposure apparatus of claim 17 further comprising means for displacing at least one of the substrate and the mask relative to the other along an optical axis of the lens system in accordance with the control deviations calculated by said calculating means.

19. The enlargement projection type exposure apparatus of claim 18 further comprising:
   a. a measuring device measuring an image magnification error of the projected circuit pattern inherent in the lens system, the projected circuit pattern on the substrate being compared with design values therefor;
   b. means for storing the image magnification error measured by said measuring device; and
   c. means for calculating control deviations of a surface level of the substrate so as to correct both the image distortion and the image magnification error measured and stored in the storing means.

20. The enlargement projection type exposure apparatus of claim 18 wherein the lens system comprises a non-telecentric enlargement projection optical system.

21. The enlargement projection type exposure apparatus of claim 20 wherein the lens system comprises a non-telecentric enlargement projection optical system.

22. The enlargement projection type exposure apparatus of claim 17 wherein said means for storing comprises an electronic data storage device.

23. The enlargement projection type exposure apparatus of claim 17 wherein said means for calculating comprises a microprocessor.

24. The enlargement projection type exposure apparatus of claim 17 wherein said means for generating a fine displacement comprises a plurality of piezoelectric elements coupled to a driver controlling said elements.

25. The enlargement projection type exposure apparatus of claim 18 wherein said means for displacing comprises a wedge z-stage.

26. The enlargement projection type exposure apparatus of claim 17 wherein said means for exposing comprises an exposure illumination system and a magnifying lens.

27. The enlargement projection type exposure apparatus of claim 17 wherein said measuring device comprises a plurality of air micrometers.

28. The enlargement projection type exposure apparatus of claim 19 wherein said measuring device comprises a plurality of air micrometers.

29. An enlargement projection type exposure apparatus for exposing a second circuit pattern onto a corresponding first projected circuit pattern already formed on a substrate, said apparatus comprising:
   a. a lens system projecting a second circuit pattern of a second mask through the lens system onto the substrate before exposure to form a pattern;
   b. a measuring device measuring an image distortion of the second projected circuit pattern of a mask inherent in the lens system, the second projected circuit pattern on the substrate being compared with design values therefor;
   c. means for storing the image distortion measured by said measuring device;
   d. a relative position detection system detecting at a plurality of predetermined points relative displacement errors between said second circuit pattern of the second mask and the corresponding first projected circuit pattern already formed on the substrate, the displacement errors being in a direction perpendicular to an optical axis of the lens system;
   e. means for calculating control deviations of a surface level of the substrate so as to correct the image distortion measured and stored in the means for storing as well as to correct the relative displacement errors detected by said relative position detection system;
   f. a positioning system including means for generating a fine displacement to elastically deform a shape of the substrate in accordance with the control deviations calculated by said calculating means; and
   g. means for exposing the second circuit pattern of the second mask onto the substrate by projecting and enlarging the pattern through the lens system.

30. The enlargement projection type exposure apparatus of claim 29 further comprising means for displacing at least one of the substrate and the mask relative to the other along an optical axis of the lens system in accordance with the control deviations calculated by said calculating means.

31. The enlargement projection type exposure apparatus of claim 30 further comprising:
   a. a measuring device measuring an image magnification error of the second projected circuit pattern inherent in the lens system, the second projected circuit pattern on the substrate being compared with design values therefor;
   b. means for storing the image magnification error measured by said measuring device; and
   c. means for calculating control deviations of a surface level of the substrate so as to correct both the image distortion and the image magnification error measured and stored in the storing means.

32. The enlargement projection type exposure apparatus of claim 30 wherein the lens system comprises a non-telecentric enlargement projection optical system.

33. The enlargement projection type exposure apparatus of claim 31 wherein the lens system comprises a non-telecentric enlargement projection optical system.

34. The enlargement projection type exposure apparatus of claim 29 wherein said means for storing comprises an electronic data storage device.

35. The enlargement projection type exposure apparatus of claim 29 wherein said means for calculating comprises a microprocessor.

36. The enlargement projection type exposure apparatus of claim 29 wherein said means for generating a fine displacement comprises a plurality of piezoelectric elements coupled to a driver controlling said elements.

37. The enlargement projection type exposure apparatus of claim 30 wherein said means for displacing comprises a wedge z-stage.

38. The enlargement projection type exposure apparatus of claim 29 wherein said means for exposing comprises an exposure illumination system and a magnifying lens.

39. The enlargement projection type exposure apparatus of claim 29 wherein said measuring device comprises a plurality of air micrometers.

40. The enlargement projection type exposure apparatus of claim 31 wherein said measuring device comprises a plurality of air micrometers.

41. An enlargement projection type exposure apparatus comprising:
   a. a lens system projecting a circuit pattern of a mask through the lens system onto a substrate before exposure to form a pattern;
   b. at least two substrate chucks such that each chuck is adapted to support a substrate;
   c. a rotary index table, said substrate chucks being disposed on said table;
   d. a mask holder positioning the mask;
   e. substrate cassettes receiving the substrate;
   f. at least two carriages loading and unloading on said chucks the substrate received in said substrate cassette;
   g. a plurality of air micrometers measuring an image distortion and an image magnification error of the projected circuit pattern of a mask inherent in the lens system, the projected circuit pattern on the substrate being compared with design values therefor;
   h. a storage device storing the image distortion and the image magnification error measured by said air micrometers;

i. a microprocessor calculating control deviations of a surface level of the substrate to correct the image distortion and the image magnification error measured and stored in the storage device;

j. a positioning system including piezoelectric elements coupled to a driver controlling said elements, said piezoelectric elements generating a fine displacement to elastically deform a shape of the substrate in accordance with the control deviations calculated by said microprocessor;

k. a wedge Z-stage displacing at least one of the substrate and the mask relative to the other along an optical axis of the lens system in accordance with the control deviations calculated by said microprocessor; and l. an exposure system exposing the circuit pattern of the mask onto the substrate by projecting and enlarging the pattern through the lens system.

42. An enlargement projection type exposure method comprising the steps of:

a. projecting a circuit pattern of a mask through an optical system onto a substrate before exposure to form a pattern;

b. comparing the projected pattern on the substrate with design values therefor;

c. measuring an image distortion of the projected circuit pattern inherent in the optical system;

d. storing the measured image distortion in means for storing e. calculating control deviations of a surface level of the substrate by means for calculating so as to correct the measured image distortion stored in the storing means;

f. generating a fine displacement to elastically deform a shape of the substrate in accordance with the calculated control deviations; and g. exposing the circuit pattern of the mask onto the substrate by projecting and enlarging the pattern through the optical system.

43. The enlargement projection type exposure method of claim 42 further comprising the step of displacing at least one of the substrate and the mask relative to the other along an optical axis of the optical system in accordance with the calculated control deviations.

44. The enlargement projection type exposure method of claim 43 further comprising the steps of:

a. measuring an image magnification error of the projected circuit pattern inherent in the optical system after the step of comparing the projected pattern with design values therefor;

b. storing the image magnification error in means for storing; and c. calculating said control deviations of a surface level of the substrate by means for calculating so as to correct both the image distortion and the image magnification error measured and stored in the storing means.

45. The enlargement projection type exposure method of claim 42 wherein the optical system comprises a reflection optical system.

46. The enlargement projection type exposure method of claim 44 wherein the lens system comprises a reflection optical system.

* * * * *

UNITED STATES PATENT AND TRADEMARK OFFICE
CERTIFICATE OF CORRECTION

PATENT NO. : 5,008,702

DATED : April 16, 1991

INVENTOR(S) : Tsutomo Tanaka et al

It is certified that error appears in the above-identified patent and that said Letters Patent is hereby corrected as shown below:

| Column | Line | |
|--------|------|---|
| 2 | 5  | After "500 mm" insert --long--. |
| 3 | 15 | Delete "making correction". |
| 3 | 67 | Change "Alignment" to --The alignment--. |
| 4 | 17 | After "by" insert --a--. |
| 4 | 35 | After "plurality" insert --of--. |
| 4 | 58 | After "driver 7" delete "which". |
| 4 | 59 | After "driver 7" insert --which--. |
| 5 | 9  | Change "comprises systems" to --system comprises--. |
| 6 | 19 | Change "Energy" to --Every--. |
| 6 | 53 | After "cause" insert --those--. |
| 6 | 58 | Before "in" delete "of". |
| 6 | 63 | Change "in the each" to --in each--. |

UNITED STATES PATENT AND TRADEMARK OFFICE
CERTIFICATE OF CORRECTION

PATENT NO. : 5,008,702            Page 2 of 2

DATED : April 16, 1991

INVENTOR(S) : Tsutomo Tanaka et al

It is certified that error appears in the above-identified patent and that said Letters Patent is hereby corrected as shown below:

| | | |
|---|---|---|
| 7 | 6 | Change "14, the" to --14. The--. |
| 7 | 37 | Change "of" to --in--. |
| 8 | 38 | After "4" insert --,--. |
| 11 | 21 | After "claim" insert --1--. |

Signed and Sealed this

Thirteenth Day of October, 1992

Attest:

DOUGLAS B. COMER

Attesting Officer      Acting Commissioner of Patents and Trademarks